(12) United States Patent
Pan

(10) Patent No.: US 6,205,057 B1
(45) Date of Patent: Mar. 20, 2001

(54) SYSTEM AND METHOD FOR DETECTING FLASH MEMORY THRESHOLD VOLTAGES

(75) Inventor: Feng Pan, San Jose, CA (US)

(73) Assignee: Advanced Micro Devices, Sunnyvale, CA (US)

( * ) Notice: Subject to any disclaimer, the term of this patent is extended or adjusted under 35 U.S.C. 154(b) by 0 days.

(21) Appl. No.: 09/504,558

(22) Filed: Feb. 15, 2000

(51) Int. Cl.[7] .................................................. G11C 16/00
(52) U.S. Cl. ................................... 365/185.21; 365/185.2
(58) Field of Search ..................... 365/185.21, 185.22, 365/189.07, 210, 185.2, 185.33

(56) References Cited

U.S. PATENT DOCUMENTS 5,600,594 * 2/1997 Paddan et al. ..................... 365/185.2
5,684,739 * 11/1997 Takeuchi ........................... 365/185.2
5,841,719 * 11/1998 Hirata ................................ 365/185.2

* cited by examiner

Primary Examiner—Tan T. Nguyen
(74) Attorney, Agent, or Firm—Brinks Hofer Gilson & Lione

(57) ABSTRACT

A memory array includes a first flash memory cell, a second flash memory cell having a programmed threshold voltage, a first current sink, a second current sink, and a control circuit. The first flash memory cell is electrically interconnected with the first current sink and the controller. The second flash memory cell is interconnected with the second current sink and the controller. A method that identifies the threshold voltage range of the first memory cell monitors the current drawn from the first and the second flash memory cells and generates a signal that identifies the threshold voltage range of the first memory cell. In an alternative memory array, a first and a second current source replace the first and second current sinks, respectively.

25 Claims, 5 Drawing Sheets

SYSTEM AND METHOD FOR DETECTING FLASH MEMORY THRESHOLD VOLTAGES

FIELD OF THE INVENTION

This invention relates to a flash memory array, and more particularly, to a system and a method for detecting one or more threshold voltage ranges of a flash memory cell.

BACKGROUND OF THE INVENTION

Electronic memories are used to store code and data on a temporary (volatile) or a permanent (non-volatile) basis. Flash memory is one type of non-volatile memory that can store and erase information in circuit. Unlike some non-volatile memory that is erased and programmed in bytes, flash memory is erased in blocks. Flash memory is versatile as some flash memory devices can interface five volt, three volt, and two volt system buses. Moreover, some flash memory devices can perform reading and programming operations simultaneously.

Flash memory can be interfaced with many circuits and can include one or more data bit densities per memory cell. Each memory cell has more than one threshold voltage range that is divided into specific bit sequences. In a one bit density cell, for example, a low voltage threshold range can be assigned a logic low state and a high voltage threshold range can be assigned a logic high state.

As memory technology develops, flash memory cells are becoming denser and assigning more bit sequences to threshold voltage ranges. With growing demand for dense memories, there is an expectation of reliably and high access speeds. Applications such as wireless technology, for example, cannot afford the expense of delayed data retrieval and code execution that can interrupt communications. While some management software tracks memory blocks reliably and efficiently, the software cannot sense the threshold voltage ranges of a flash memory cell. Flash memory sensing circuits can be complicated and can require expansive circuit space which is not always available in high performance micro-technologies. The present invention is directed to overcome these drawbacks of the prior art.

DETAILED DESCRIPTION OF THE PRESENTLY PREFERRED EMBODIMENTS

When a flash memory cell is programmed, a charge is stored on a floating gate of a transistor. The charge stored on the floating gate creates a voltage potential that is unique to a single or a multiple bit string. When this voltage potential is compared to one or more known threshold voltage ranges ($V_{ts}$), a threshold voltage range is identified. The threshold voltage range can be decoded into a single or a multiple bit string. In a single bit memory cell, for example, the threshold voltage range can define a logic high (1) or a logic low (0) state.

Ultimately, to read from or to write to a flash memory cell the threshold voltage ranges of a flash memory cell must be known. Unfortunately, component tolerances, temperature variations, and power fluctuations adversely affect detecting threshold voltage ranges. The disclosed system and method detect threshold voltage ranges over a wide range of tolerances and conditions.

Figure 1:
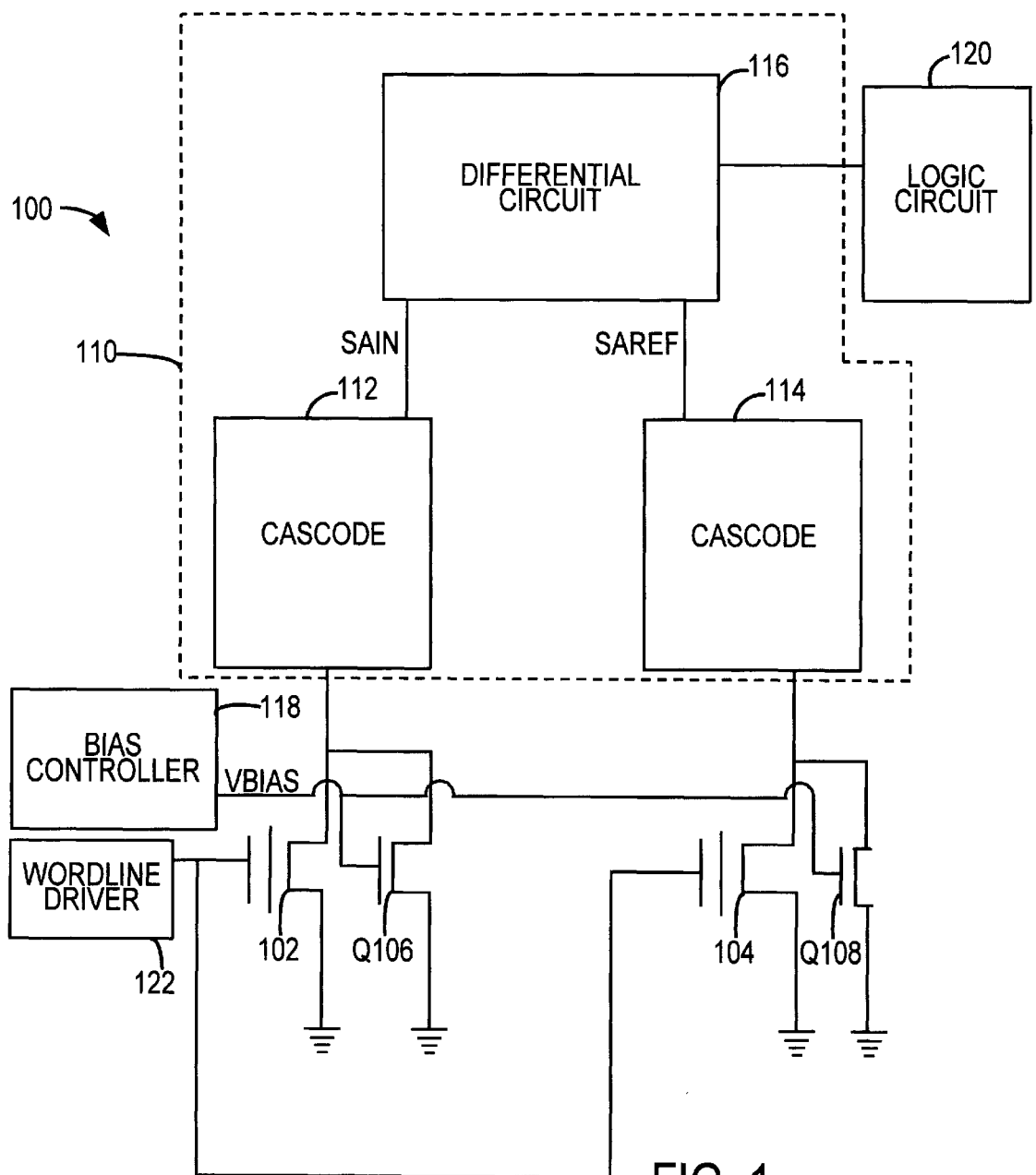
FIG. 1 illustrates a block diagram of a first embodiment.

FIG. 1 shows a block diagram of a memory array 100 incorporating a first preferred embodiment. The memory array 100 includes a first flash memory cell 102, a second flash memory cell 104, a pair of current sinks Q106 and Q108, and a controller 110. The controller 110 includes a pair of cacode circuits 112 and 114 and means for determining the threshold voltage ranges of first memory cell 102, 116. Preferably, determining means 116 is a differential circuit and preferably second flash memory cell 104 is programmed to a threshold voltage.

As shown in FIG. 1, first flash memory cell 102, second flash memory cell 104, and current sinks Q106 and Q108 are drained biased by cascode circuits 112 and 114, respectively. In this configuration, current passes through first and second flash memory cells 102 and 104 when a common gate bias (WORDLINE) is applied to the gates by a WORDLINE controller 122. These currents are inversely proportional to the threshold voltage ranges of first and second flash memory cells 102 and 104, respectively. The cascode circuits 112 and 114 supply, sense, and convert the currents into differential output voltages. The differential circuit 116 decodes the differential output voltages into a binary string that identifies the threshold voltage ranges of first flash memory cell 102.

Due to the adverse effect of component tolerances, temperature variations, and power fluctuations, the differential output voltages of cascode circuits 112 and 114 are adjusted to drive the differential circuit 116 to an optimum common mode region. Under adverse conditions, current is drawn by current sinks Q106 and Q108 to proportionately increase the differential output voltages of cascode circuits 112 and 114. The proportional increases do not change the incremental difference between the differential output voltages.

By using a pair of matched current sinks Q106 and Q108 sharing a common gate bias, the difference between the current drawn by first flash memory cell 102 and second flash memory cell 104 is maintained. The current sinks Q106 and Q108 are programmed to draw the same quantities of current which proportionately adjust the differential output voltages of cascode circuits 112 and 114. The adjusted differential output voltages drive differential circuit 116 to an optimum common mode region.

Figure 2:
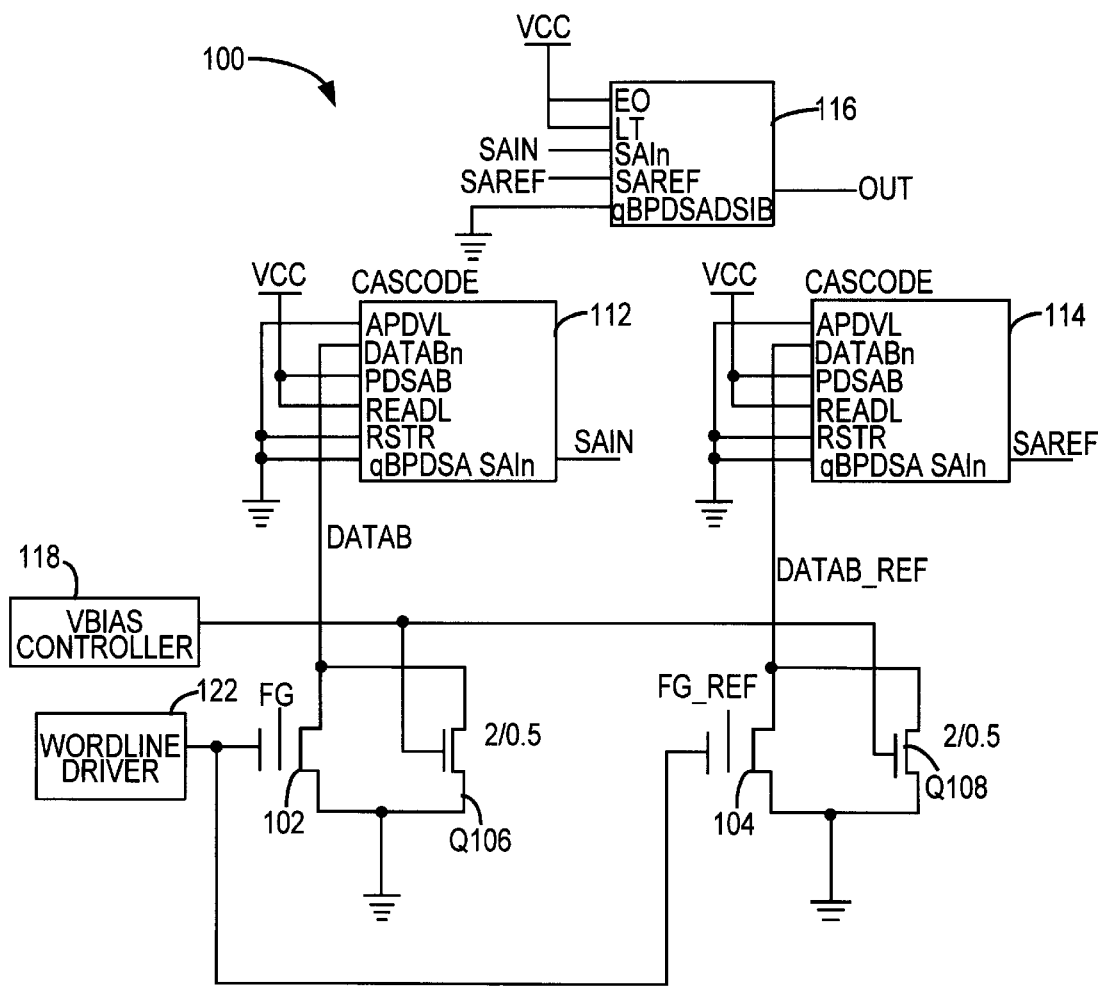
FIG. 2 illustrates a circuit diagram of a memory array of FIG. 1.

FIG. 2 illustrates a circuit diagram of flash memory array 100. First flash memory cell 102 is connected with transistor Q106. First flash memory cell 102 and transistor Q106 are drain biased by current DATAB. Similarly, second flash memory cell 104 is connected with transistor Q108. Second flash memory cell 104 and transistor Q108 are drain biased by current DATAB_REF. Transistors Q106 and Q108 share a programmed gate bias driven by an external source, such as a bias controller 118 for example. The bias controller 118 drives transistors Q106 and Q108 to sink an equal quantity of current from cascode circuits 112 and 114, respectively. The availability of matched transistors Q106 and Q108 assures each cascode circuit 112 and 114 sources a sufficient quantity of current and generates a sufficient proportional voltage to drive differential circuit 116 to an optimum common mode region.

Figure 3:
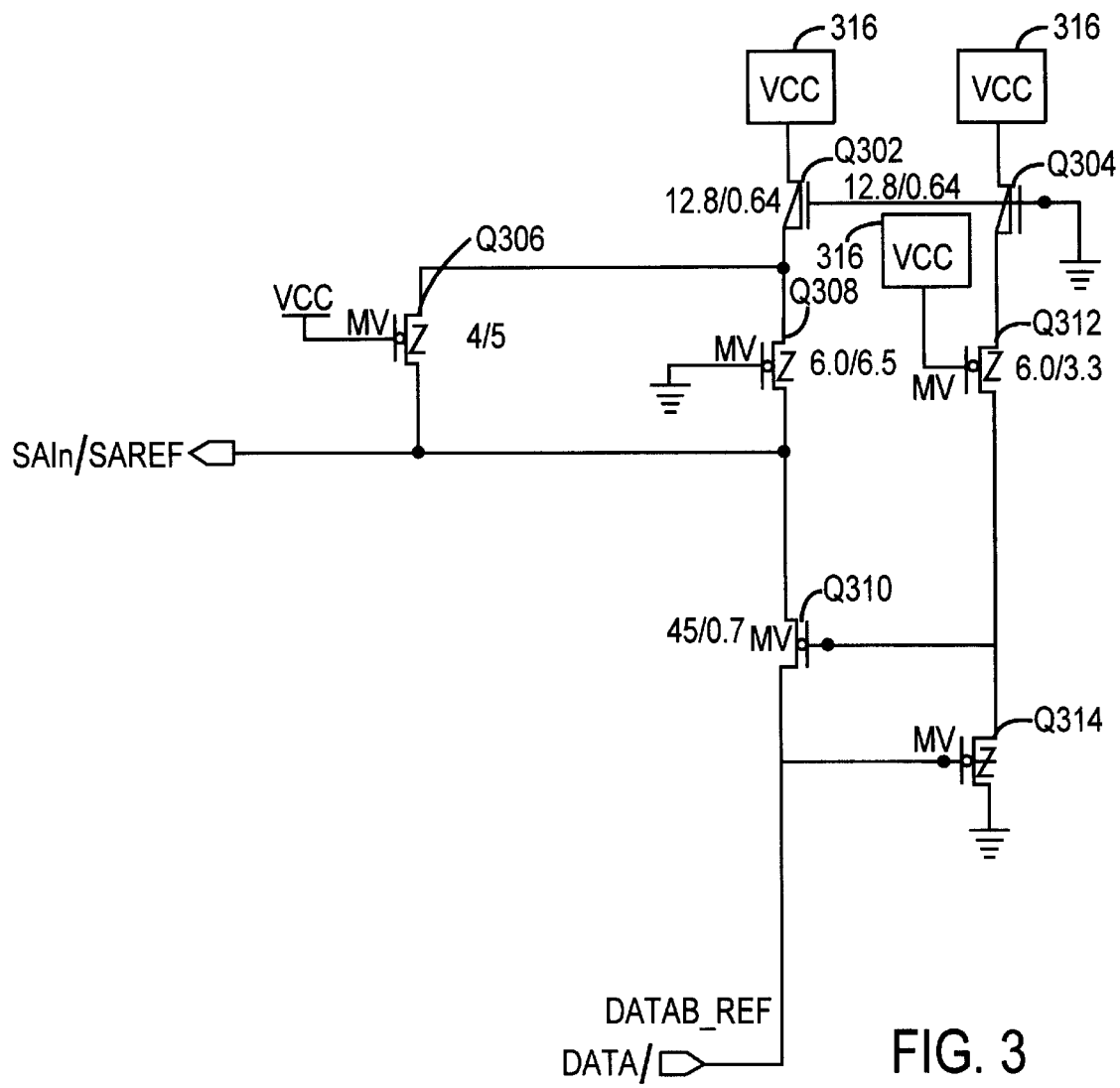
FIG. 3 illustrates a partial schematic diagram of a cascode circuit shown in FIG. 2.

FIG. 3 illustrates a partial schematic diagram of cascode circuit 112. In cascode circuit 112, the gates of transistors Q302 and Q304 are connected to signal ground. A power source 316 is electrically connected to the source of transistor Q302. The drain of transistor Q302 is electrically connected to the drains of transistors Q306 and Q308. Because transistors Q302 and Q304 are p-channel type enhancement-type MOSFETS, the ground bias of the gate causes current to flow from the drains. Transistor Q306, which is preferably an n-channel type enhancement-type MOSFET, conducts the drain current of transistor Q302 to the sense amplifier input (SAIN) and the drain of transistor Q310. Transistor Q310 is gate biased by the source of transistor Q312. In addition to providing a gate bias to transistor Q310, transistor Q312 provides a drain bias to transistor Q314. The gate bias of Q310 conducts the source current of Q306 to output current DATATAB and provides a gate bias to Q314. The gate bias of Q314 causes current to flow from the drain of Q314 to ground. Cascode circuit 114 is identical to cascode circuit 112. Only the output reference letters SAIN and DATATAB are changed to SAREF and DATAB_REF, respectively, as shown in FIG. 3.

Figure 4:
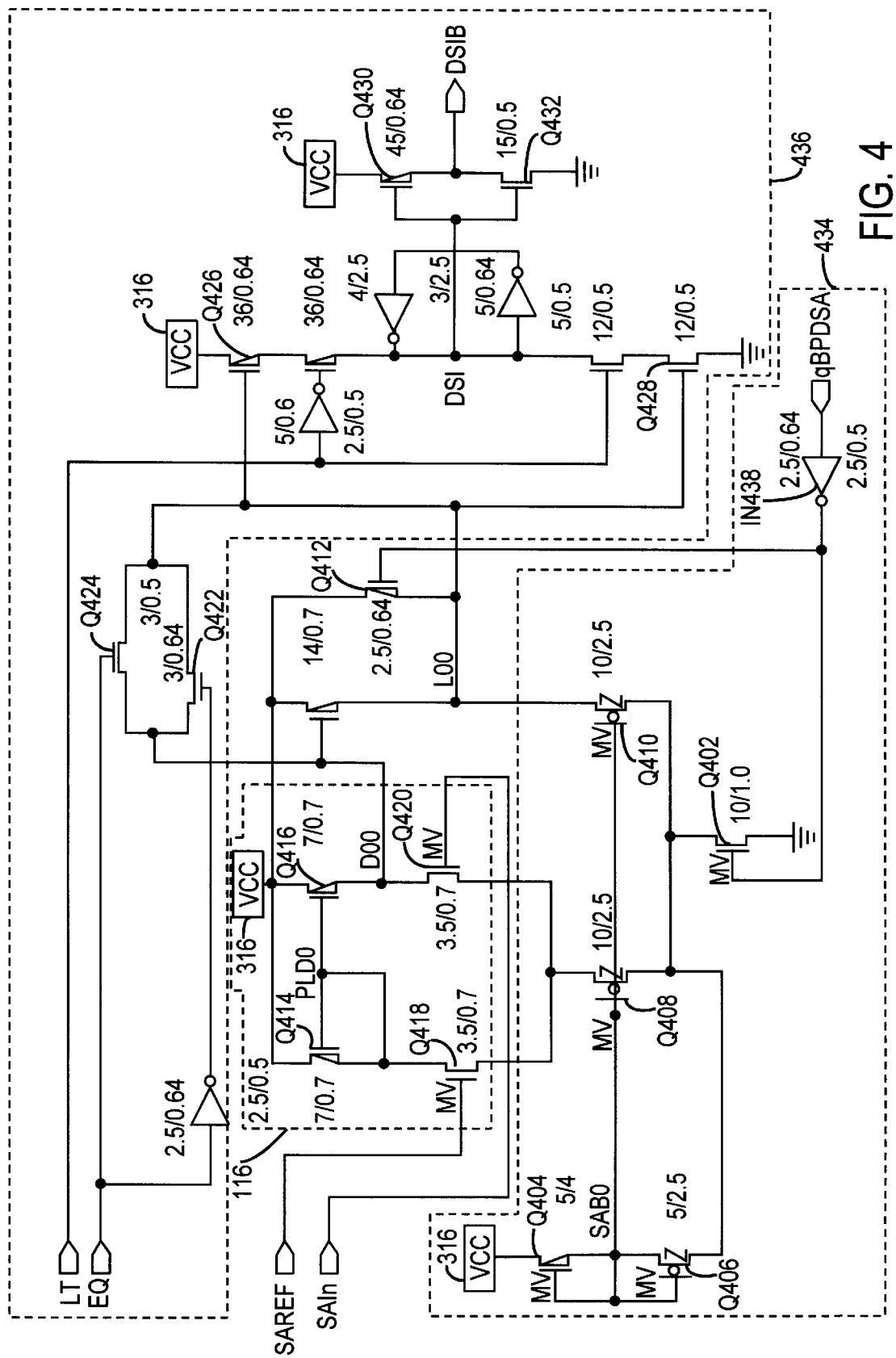
FIG. 4 illustrates a schematic diagram incorporating a differential circuit shown in FIG. 2.

FIG. 4 illustrates a schematic diagram of a circuit incorporating differential circuit 116. The circuit includes a ground circuit 434 and an output circuit 436. An input signal QBPDSA enters inverter IN438. Because QBPDSA is connected to signal ground, an output bias is fed to the gates of transistors Q402 and transistor Q412. The bias of Q402 provides a signal ground to transistors Q406, Q408, and Q410. When the gate source voltage of transistor Q404 is lower than the power source voltage, transistor Q404 conducts providing a gate bias to transistors Q408 and Q410.

The differential circuit 116 shown in FIG. 4 includes transistors Q418 and Q420, which form a differential pair source biased by transistor Q408. A load circuit consisting of transistors Q414 and Q416 are connected in a current mirror configuration to transistors Q418 and Q420. Preferably, transistors Q414 and Q416 are p-channel type enhancement-type MOSFETS. The output of the differential circuit 116 is taken single-endedly from transistors Q416 and Q420.

When control signals LT and EQ are at a logic high state, the output of differential circuit 116 provides a gate bias to transistors Q426 and Q428. Transistor Q426 inverts the output of differential circuit 116, which is inverted by a differential half circuit Q430 and Q432.

The output of differential half circuit Q430 and Q432 is connected to a logic circuit 120 (shown in FIG. 1) through either a parallel or a serial interface. When sense amplifier input (SAIN) is greater than sense amplifier reference (SAREF), a threshold voltage range of first flash memory cell 102 is greater than second flash memory cell 104 and a bit sequence is identified. If first flash memory cell 102 has a one bit density, a logic high state is detected. Likewise, when sense amplifier input (SAIN) is less than sense amplifier reference (SAREF), a threshold voltage range of first flash memory cell 102 is less than second flash memory cell 104 and a bit sequence is known. If first memory flash cell 102 has a one bit density, a logic low state is detected. Of course, specific bit lengths and bit sequences will vary with the densities of the flash memory cells and the programmed threshold voltage ranges.

Figure 5:
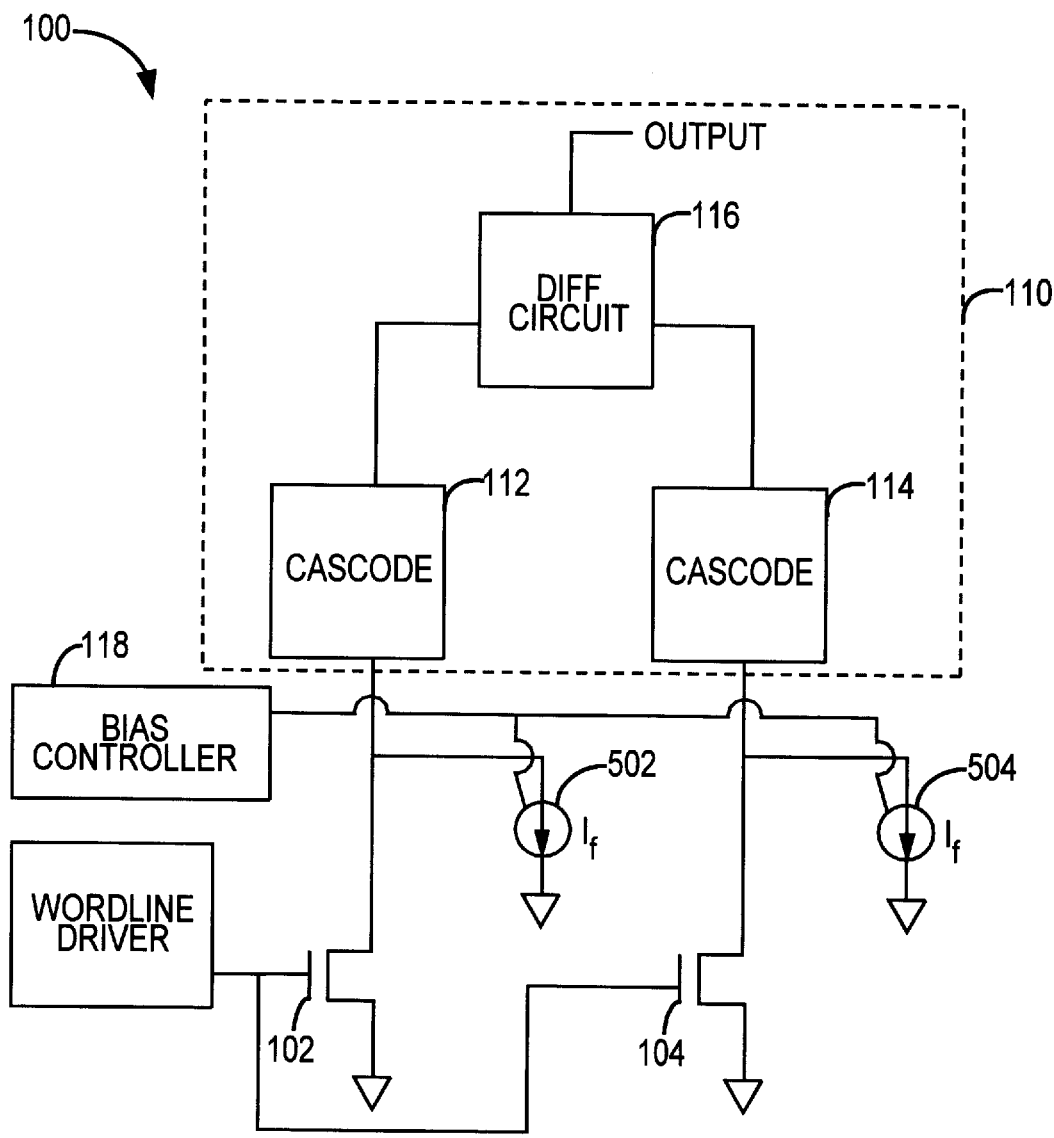
FIG. 5 illustrates a block diagram of a second embodiment.

FIG. 5 shows a block diagram of the memory array 100 incorporating a second preferred embodiment. The memory array 100 includes first flash memory cell 102, second flash memory cell 104, a pair of current sources 502 and 504, and controller 110. Controller 110 includes cascode circuits 112 and 114 and differential circuit 116. Differential circuit 116 is preferably a differential amplifier circuit while current sources 502 and 504 are preferably programmable current sources. Second flash memory cell 104 is preferably programmed to a threshold voltage.

As shown in FIG. 5, first flash memory cell 102, second flash memory cell 104 are drained biased by current sources 502 and 504 and by cascode circuits 112 and 114. In this configuration, the currents that pass through first and second flash memory cells 102 and 104 are inversely proportional to the threshold voltage ranges of first and second flash memory cells 102 and 104, respectively. The cascode circuits 112 and 114 supply, sense, and convert the currents into a differential output voltage. The differential circuit 116 decodes the differential output voltage into a binary string that identifies a threshold voltage range, and thus, detects the logic state of first flash memory cell 102.

From the foregoing descriptions it should be apparent that a differential circuit without a ground circuit or an output circuit can decode the differential output voltages in other preferred embodiments. Furthermore, the component dimensions shown in FIGS. 2–4 illustrate preferred substrate lengths/widths. These dimensions should not be considered limiting.

The above described system and method optimizes input common mode voltage levels to differential circuit 116 and improves the performance of differential circuit 116. The invention compensates for component, temperature, and power variations that can adversely affect the output currents (DATAB and DATAB_REF) of cascode circuits 112 and 114 by providing programmed current sinks Q106 and Q108 or programmed current sources 502 and 504. By providing a programmed bias to current sinks Q106 and Q108 or current sources 502 and 504, bias controller 118 increases the current drawn from cascode circuits 112 and 114 while maintaining the incremental difference between the quantity of current (DATAB) drawn from cascode circuit 112 and the quantity of current (DATAB_REF) drawn from cascode circuit 114. Preferably, programmed control establishes an optimum sense amplifier input (SAIN) signal and an optimum sense amplifier reference (SAREF) signal. In some preferred embodiments, the optimum sense amplifier input (SAIN) and sense amplifier reference (SAREF) signals will be approximately one half of the power source voltage.

The invention seamlessly combines a system and a method that identifies threshold voltage ranges of flash memory cells. The programmable current sinks Q106 and Q108 or current sources 502 and 504 can be used in a read and/or a write reference cell array with memory cells and reference cells having single or multiple bit densities. The system and method preferably compensates for component, temperature, and power variations making it compatible with many applications.

The foregoing description describes only a few of the many forms that the invention takes, and therefore should be taken as illustrative rather than limiting. It is only the following claims, including all equivalents that are intended to define the scope of the invention.

What is claimed is:

1. A memory array comprising:
   a first flash memory cell;
   a second flash memory cell having a programmed threshold voltage;
   a first current sink electrically interconnected with the first flash memory cell;
   a second current sink electrically interconnected with the second flash memory cell; and
   a control circuit electrically interconnected with the first and the second flash memory cell to detect a threshold voltage range of the first flash memory cell.

2. The memory array of claim 1 wherein the first flash memory cell and the second flash memory cell have a programmable signal input, respectively, that are electrically interconnected.

3. The memory array of claim 1 wherein the first current sink and the second current sink are programmable current sinks.

4. The memory array of claim 1 wherein the first current sink and the second current sink have a programmable signal input, respectively, that control the current drawn by the first current sink and the second current sink.

5. The memory array of claim 4 wherein the programmable signal inputs of the current sinks are electrically interconnected.

6. The memory array of claim 1 wherein the first flash memory cell and the first current sink are interconnected at an output of the controller and at an electrical ground.

7. The memory array of claim 1 wherein the second flash memory cell and the second current sink are interconnected at an output of the controller and at an electrical ground.

8. The memory array of claim 1 wherein the first flash memory cell and the first current sink are interconnected at a first output of the controller and at an electrical ground and the second flash memory cell and the second current sink are interconnected at a second output of the controller and at the electrical ground.

9. The memory array of claim 1 wherein the controller includes a first and a second cascode circuit, in which each of the first and the second cascode circuits has an output to source current, in which the output of the first cascode circuit sources current to at least the first flash memory cell while the output of the second cascode circuit sources current to at least the second flash memory cell.

10. The memory array of claim 1 wherein the controller includes a first and a second cascode circuit, in which each of the first and the second cascode circuits has an output to source current, in which the output of the first cascode circuit sources current to at least the first flash memory cell and the first current sink while the output of the second cascode circuit sources current to at least the second flash memory cell and the second current sink.

11. The memory array of claim 1 wherein the controller includes a first cascode circuit, in which the first cascode circuit has a first output to source current and a second output to source voltage proportional to the sourced current.

12. The memory array of claim 11 wherein the controller includes a second cascode circuit, in which the second cascode circuit has a first output to source current and a second output to source voltage proportional to the sourced current of the second cascode circuit.

13. The memory array of claim 12 wherein the controller includes a differential amplifier having a first and a second input, in which the first input of the differential amplifier is electrically interconnected with the second output of the first cascode circuit and the second input of the differential amplifier is electrically interconnected with the second output of the second cascode circuit.

14. The memory array of claim 13 wherein the differential amplifier has at least one output to deliver a signal that identifies the threshold voltage range of the first flash memory cell.

15. The memory array of claim 1 wherein the controller includes a differential amplifier and at least one cascode circuit, in which the cascode circuit is electrically interconnected with the differential amplifier, the first flash memory cell, and the second flash memory cell.

16. A memory array comprising:
a first flash memory cell;
a second flash memory cell having a programmed threshold voltage;
a first programmable current source electrically interconnected with the first flash memory cell;
a second programmable current sink electrically interconnected with the second flash memory cell; and
a reference means for determining the threshold voltage range of the first memory cells by comparing differential input signals.

17. The memory array of claim 16 wherein the reference means comprises a differential circuit to generate a discrete logic output that identifies the threshold voltage range of the first memory cell.

18. A method of determining a threshold voltage range of a memory cell comprising:
interconnecting a first current sink with a first flash memory cell;
interconnecting a second current sink with a second flash memory cell having a programmed threshold voltage;
applying a drain current to the first and the second flash memory cell;
sensing the current drawn from the first and the second flash memory cell; and
identifying the threshold voltage range of the first memory cell through a comparison of the current drawn from the first and the second flash memory cells.

19. The method of claim 18 wherein the act of interconnecting a first current sink with a first flash memory cell comprises interconnecting the first current sink with the first flash memory cell at an output of a first cascode circuit.

20. The method of claim 19 wherein the act of interconnecting a second current sink with a second flash memory cell comprises interconnecting the second current sink with the second flash memory cell at an output of a second cascode circuit.

21. The method of claim 18 wherein the act of identifying the threshold voltage range comprises:
generating a differential input based in part on the current sensed from the first and the second flash memory cells; and
feeding the differential input a differential amplifier to generates a discrete output.

22. A memory array comprising:
a first flash memory cell;
a second flash memory cell having a programmed threshold voltage;
a first current source electrically interconnected with the first flash memory cell;
a second current source electrically interconnected with the second flash memory cell; and
a control circuit electrically interconnected with the first and the second flash memory cell to detect a threshold voltage range of the first flash memory cell.

23. The memory array of claim 22 wherein the first flash memory cell and the second flash memory cell have a programmable signal input, respectively, that are electrically interconnected.

24. The memory array of claim 22 wherein the first current source and the second current source are programmable current sources.

25. The memory array of claim 22 wherein the first current source and the second current source have a programmable signal input, respectively, that control the current driven by the first current source and the second current source.

* * * * *